(12) United States Patent
Roh

(10) Patent No.: US 11,302,765 B2
(45) Date of Patent: Apr. 12, 2022

(54) DISPLAY DEVICE

(71) Applicant: Samsung Display Co., LTD., Yongin-si (KR)

(72) Inventor: Myong Hoon Roh, Cheonan-si (KR)

(73) Assignee: Samsung Display Co., LTD., Yongin-si (KR)

( * ) Notice: Subject to any disclaimer, the term of this patent is extended or adjusted under 35 U.S.C. 154(b) by 227 days.

(21) Appl. No.: 16/808,272

(22) Filed: Mar. 3, 2020

(65) Prior Publication Data

US 2020/0286977 A1    Sep. 10, 2020

(30) Foreign Application Priority Data

Mar. 5, 2019    (KR) .................. 10-2019-0025220

(51) Int. Cl.
*H01L 27/32* (2006.01)
*H01L 51/00* (2006.01)
*G09G 3/3291* (2016.01)

(52) U.S. Cl.
CPC ....... *H01L 27/3276* (2013.01); *G09G 3/3291* (2013.01); *H01L 51/0097* (2013.01)

(58) Field of Classification Search
CPC ............. H01L 27/3276; H01L 51/0097; H01L 27/3244; H01L 51/5253; H01L 27/156; H01L 27/3262; H01L 51/52; G09G 3/3291; G09G 3/006; G09G 2300/0426; G09G 3/20; Y02E 10/549; G09F 9/33; H05K 1/181; H05K 1/111; H05K 1/147
See application file for complete search history.

(56) References Cited

U.S. PATENT DOCUMENTS

| | | | |
|---|---|---|---|
| 9,131,633 B2 | 9/2015 | Miura et al. | |
| 2017/0365569 A1 | 12/2017 | Kriebel | |
| 2018/0131031 A1 | 5/2018 | Ku et al. | |
| 2020/0013330 A1* | 1/2020 | Kim | G09G 3/3208 |

FOREIGN PATENT DOCUMENTS

KR    20200004932    1/2020

* cited by examiner

*Primary Examiner* — Kyoung Lee
(74) *Attorney, Agent, or Firm* — H.C. Park & Associates, PLC

(57) ABSTRACT

A display device includes a display panel including a display area including a plurality of pixels, and a pad area disposed around the display area; and a printed circuit board on which a plurality of lead wirings attached to the pad area of the display panel are disposed, wherein the display panel includes a plurality of signal wirings disposed on the pad area of the display panel and connected to the pixels, and an inorganic pattern disposed between each of the signal wirings and each of the lead wirings.

20 Claims, 19 Drawing Sheets

DISPLAY DEVICE

CROSS-REFERENCE TO RELATED APPLICATION

This application claims priority from and the benefit of Korean Patent Application No. 10-2019-0025220 filed on Mar. 5, 2019, which is hereby incorporated by reference for all purposes as if fully set forth herein.

BACKGROUND

Field

Exemplary implementations of the invention relate generally to a display device and, more particularly, to a display device having internal structures that facilitate testing to determine whether bonding between signal wires and PCB connection pads are defective.

Discussion of the Background

A display device is a device for visually displaying data. The display device includes a substrate which is divided into a display area and a non-display area. In the display area, a plurality of pixels is disposed on the substrate. In the non-display area, a plurality of pads and the like are disposed on the substrate. A flexible film (COF film) provided with a driving circuit and the like is coupled to the plurality of pads to transmit driving signals to the pixels.

The flexible film may include a plurality of leads coupled to the plurality of pads, and the respective leads may be separately bonded to the pads. The bonding may be performed through an anisotropic conductive film or an ultrasonic bonding process in which the pad and the lead are directly surface-bonded to each other.

However, when the pad and the lead are directly surface-bonded to each other in the ultrasonic bonding process, since a marker does not remain unlike the bonding process using the anisotropic conductive film (ACF), it is difficult to determine whether bonding is acceptable or defective through an image of the marker.

The above information disclosed in this Background section is only for understanding of the background of the inventive concepts, and, therefore, it may contain information that does not constitute prior art.

SUMMARY

Display devices constructed according to the principles and exemplary implementations of the invention include a pad having a marker caused by an ultrasonic bonding process which may take the form of a recessed pattern. The marker may be visible during an inspection process to test whether bonding between leads for the signal wires of the display and pads for connecting to a circuit board are defective.

Additional features of the inventive concepts will be set forth in the description which follows, and in part will be apparent from the description, or may be learned by practice of the inventive concepts.

According to an aspect of the invention, a display device includes a display panel including a display area including a plurality of pixels, and a pad area disposed at least partially around the display area; and a printed circuit board having a plurality of lead wirings attached to the pad area of the display panel are disposed, wherein the display panel includes a plurality of signal wirings disposed on the pad area of the display panel and connected to the pixels, and a pattern disposed between each of the signal wirings and at least some of the lead wirings, the pattern including areas of higher rigidity than the signal wirings and the lead wirings.

The display panel may include a connection wiring disposed below the signal wiring and having a planar size smaller than the signal wiring, and an insulation pattern disposed between the connection wiring and the signal wiring, and wherein the insulation pattern exposes a part of the connection wiring, and the exposed connection wiring is electrically connected to the signal wiring.

The high rigidity pattern may be surrounded by the insulation pattern.

They signal wiring may include a pad pressing portion which overlaps the high rigidity pattern, and a pad bonding portion which does not overlap the high rigidity pattern, and the pad pressing portion of the signal wiring is in contact with the high rigidity pattern.

The pad bonding portion may be coupled to the lead wiring, and a thickness of the pad bonding portion from a surface of the connection wiring is greater than a thickness of the pad pressing portion from the surface of the connection wiring.

The pad bonding portion may be directly connected to the lead wiring.

The pad bonding portion may be ultrasonically connected to the lead wiring.

The lead wiring may include a lead pressing portion which overlaps the high rigidity pattern, and a lead bonding portion which does not overlap the high rigidity pattern, and the lead pressing portion is in contact with the high rigidity pattern.

The lead wiring may include a first lead surface facing the signal wiring and a second lead surface opposite to the first lead surface, and a thickness from the second lead surface of the lead bonding portion to the first lead surface is greater than a thickness from the second lead surface of the lead pressing portion to the first lead surface.

The high rigidity pattern may include plurality of inorganic units, the plurality of inorganic units are arranged in a direction from an end of the pad area toward the display area, and the insulation pattern includes a main pattern portion covering an edge of the connection wiring and a bridge pattern portion disposed between the adjacent inorganic units.

The plurality of inorganic units may define a plurality of contact holes disposed between the main pattern portion and the bridge pattern portion, and each of the contact holes is disposed to overlap the plurality of inorganic units.

Each of the signal wiring may include a pad pressing portion which overlaps each of the plurality of inorganic units, a first pad bonding portion which does not overlap each of the plurality of inorganic units, and does not overlap the insulation pattern, and a second pad bonding portion which does not overlap each of the plurality of inorganic units and overlaps the insulation pattern, and the pad pressing portion of the signal wiring is in contact with each of the plurality of inorganic units.

Each of the first pad bonding portion and the second pad bonding portion may be coupled to each of the lead wiring, and a thickness of the second pad bonding portion from a surface of the connection wiring is greater than a thickness of the first pad bonding portion from the surface of the connection wiring.

The high rigidity pattern may include inorganic areas.

The inorganic area may include an inorganic insulating material, and the inorganic insulating material includes silicon oxide or nitrogen oxide.

Each of the inorganic patterns may include a metal material.

According to an aspect of the invention, a display device includes a display substrate having a display area including a plurality of pixels, and a pad area disposed at least partially around the display area; a plurality of signal wirings disposed on the pad area of the display substrate and connected to the pixels; a plurality of lead wirings attached to pads in the pad area; a connection wiring disposed below the signal wiring and having a planar size smaller than the signal wiring; an insulation pattern disposed between the connection wiring and the signal wiring; and an inorganic pattern disposed on each of the signal wirings, wherein the insulation pattern exposes a part of the connection wiring, and the exposed connection wiring is electrically connected to the signal wiring, wherein each of the signal wirings includes a first surface facing the connection wiring and a second surface opposite to the first surface, and wherein the high rigidity pattern is disposed on the second surface of at least some of the signal wirings.

The inorganic pattern may be surrounded by the insulation pattern, the signal wiring includes a pad pressing portion which overlaps the high rigidity pattern, and a pad bonding portion which does not overlap the inorganic pattern, and the pad pressing portion of the signal wiring is in contact with the high rigidity pattern.

The pad bonding portion may be coupled to the lead wiring, a thickness of the pad bonding portion from a surface of the connection wiring is greater than a thickness of the pad pressing portion from the surface of the connection wiring, and the pad bonding portion is directly connected to the lead wiring.

The pad bonding portion may be ultrasonically connected to the lead wiring.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
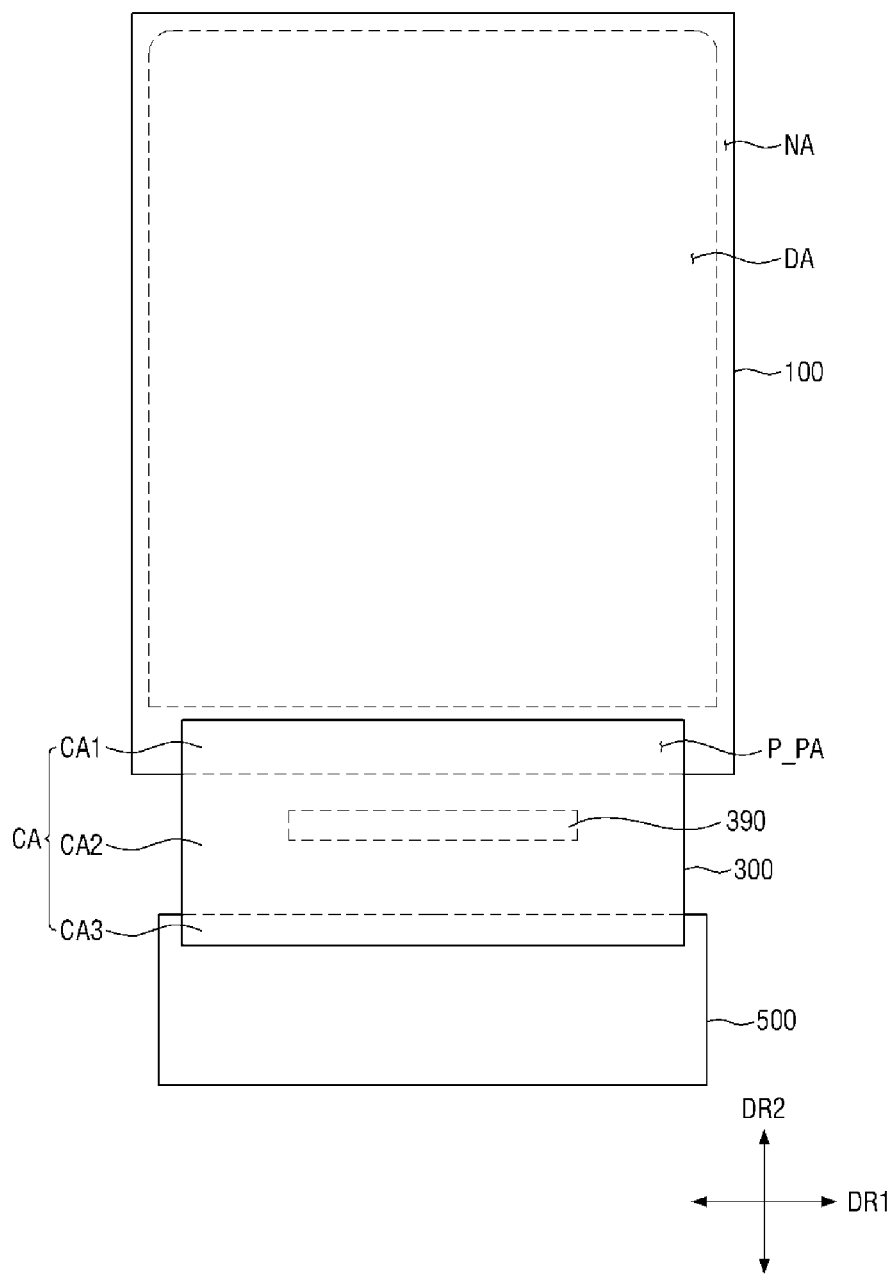
FIG. 1 is a plan view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
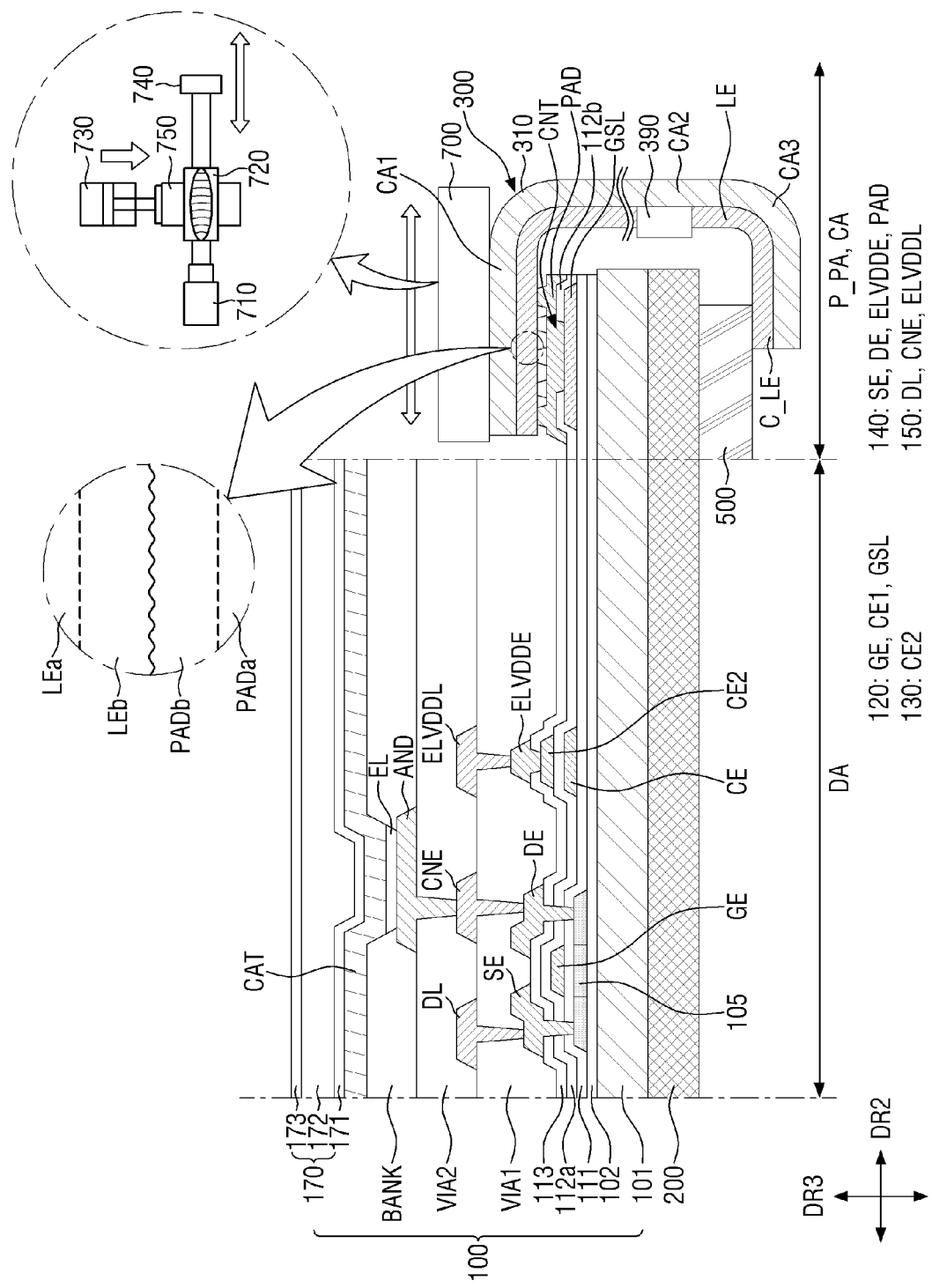
FIG. 2 is a partial, fragmented cross-sectional view of the display device of FIG. 1.
Figure 3A:
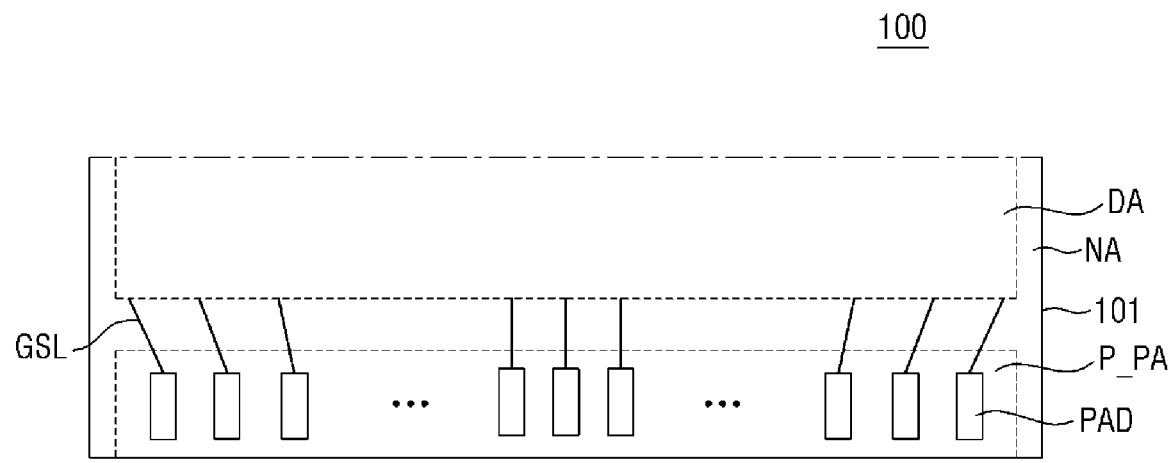
FIGS. 3A and 3B are plan views schematically showing a layout of a pad area of the display device of FIG. 1 and a partial layout of a first circuit board of FIG. 1.
Figure 3B:
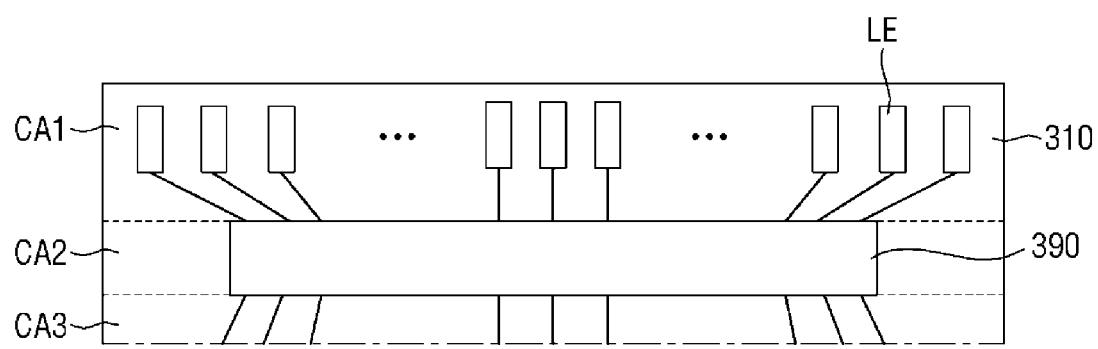
Figure 3B:
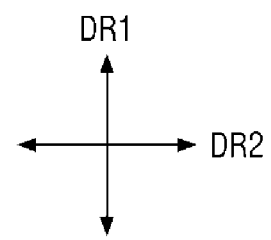
Figure 4:
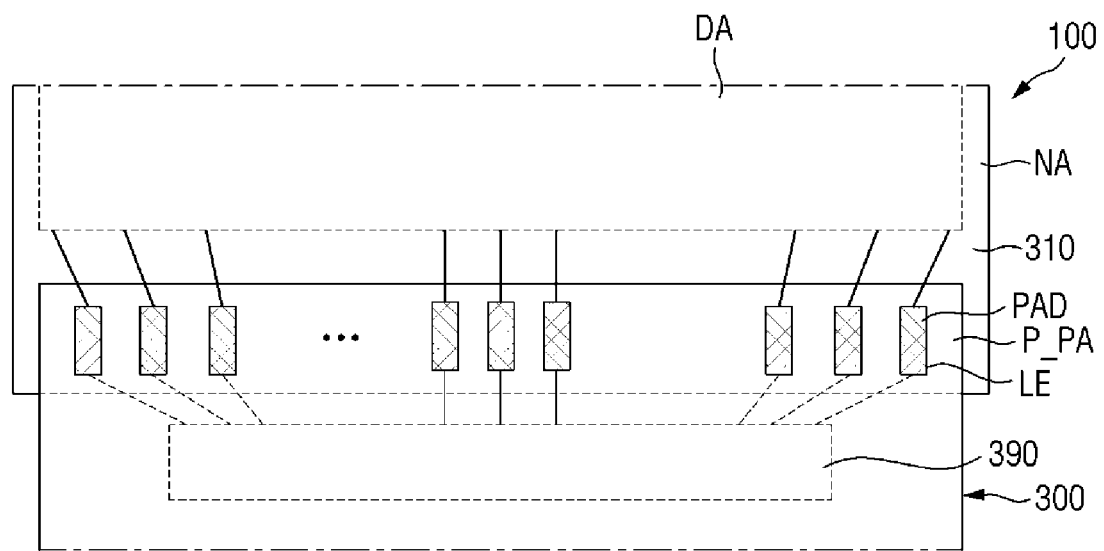
FIG. 4 is a plan view showing a schematic layout of the panel pad area of FIG. 3A attached to the first circuit board of FIG. 3B.
Figure 4:
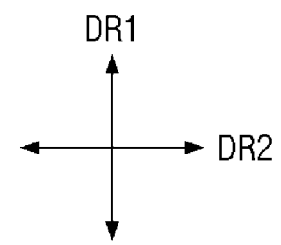

FIG. 1 is a plan view of a display device according to an exemplary embodiment. FIG. 2 is a cross-sectional view of the display device of FIG. 1. FIG. 3 is a plan view showing a layout of a pad area and a partial layout of a first circuit board. FIG. 4 is a plan view showing a schematic layout of a panel pad area of a display panel and a first circuit board attached to the panel pad area.

A display device 1 is a device for displaying moving images or still images. The display device may be used as a display screen of various products such as a television, a laptop computer, a monitor, a billboard and the Internet of Things, as well as a portable electronic device such as a mobile phone, a smart phone, a tablet personal computer (PC), a smart watch, a watch phone, a mobile communication terminal, an electronic notebook, an electronic book, a portable multimedia player (PMP), a navigation device, an ultra-mobile PC (UMPC) or the like.

Referring to FIGS. 1 to 4, the display device 1 may include a display panel 100 for displaying an image, a first circuit board 300 connected to the display panel 100 and a second circuit board 500 connected to the first circuit board 300.

The display panel 100 may be a light emitting display panel including a plurality of light emitting elements. For example, the display panel 100 may be an organic light emitting display panel using an organic light emitting diode (LED), a micro LED display panel using a micro LED, a quantum dot light emitting display panel including a quantum dot LED or any other known display panel. In the following description, a case where the display panel 100 is an organic light emitting display panel will be described mainly for convenience.

The display panel 100 includes a display area DA including a plurality of pixel areas and a non-display area NA disposed around the display area DA. The display area DA may have a rectangular shape having vertical edges or rounded edges in a plan view. The display area DA may have short and long sides. The short side of the display area DA may extend in a first direction DR1. The long side of the display area DA may extend in a second direction DR2.

However, the planar shape of the display area DA is not limited to a rectangular shape, but may have various other shapes such as a circular shape, an elliptical shape, or the like. The non-display area NA may be disposed adjacent to both short sides and both long sides of the display area DA. In this case, the non-display area NA may constitute a border of the display area DA to surround all sides of the display area DA. However, the exemplary embodiments are not limited thereto, and the non-display area NA may be disposed adjacent to only both short sides or both long sides of the display area DA.

The non-display area NA of the display panel 100 further includes a panel pad area P_PA. The panel pad area P_PA may be disposed, for example, on the periphery of one short side of the display area DA, but the exemplary embodiments are not limited thereto. The panel pad area P_PA may be disposed on the periphery of both short sides of the display area DA or on the periphery of both short sides and both long sides of the display area DA.

As shown in FIG. 2, the first circuit board 300 may include a printed base film 310 and a driving integrated circuit 390 disposed on the printed base film 310. The printed base film 310 may include an insulating material.

Referring back to FIG. 1, the first circuit board 300 may include a first circuit area CA1 having one side attached to the panel pad area P_PA of the display panel 100, a second circuit area CA2 disposed on one side of the first circuit area CA1 in the second direction DR2, and a third circuit area CA3 disposed on one side of the second circuit area CA2 in the second direction DR2 and to which the second circuit board 500 is attached. The second circuit area CA2 extends between the first and third circuit areas CA1 and CA3. The driving integrated circuit 390 may be disposed on one surface of the second circuit area CA2 of the first circuit board 300. The driving integrated circuit 390 may be, for example, a data driving integrated circuit, and a chip on film (COF) method implemented by a data driving chip may be applied thereto.

The second circuit board 500 may include a circuit pad area attached to the third circuit area CA3 of the first circuit board 300. A plurality of circuit pads may be disposed in the circuit pad area of the second circuit board 500 and connected to lead wirings disposed in the third circuit area CA3 of the first circuit board 300.

Referring to FIG. 2, the display device 1 further includes a panel lower sheet 200 disposed below the display panel 100. The panel lower sheet 200 may be attached to the back surface of the display panel 100. The panel lower sheet 200 includes at least one functional layer. The functional layer may be a layer that performs a heat dissipation function, an electromagnetic shielding function, a grounding function, a buffering function, a rigidity enhancing function, a supporting function and/or a digitizing function. The functional layer may be a sheet layer, a film layer, a thin layer, a coating layer, a panel, a plate, or the like. The functional layer may be formed of a single layer, but may also be formed of a plurality of laminated thin films or coating layers. The functional layer may be, for example, a supporting substrate, a heat dissipation layer, an electromagnetic shielding layer, an impact absorbing layer, a digitizer, or the like.

The first circuit board 300 may be bent downward in a third direction DR3 as shown in FIG. 2. The other side of the first circuit board 300 and the second circuit board 500 may be located below the panel lower sheet 200. The lower surface of the panel lower sheet 200 may be coupled to the second circuit board 500 through an adhesive layer, but the exemplary embodiments are not limited thereto.

The display panel 100 may include a display substrate 101, a plurality of conductive layers, a plurality of insulating layers for electrically isolating the conductive layers, and an organic light emitting layer EL.

The display substrate 101 is disposed substantially entirely over the display area DA and the non-display area NA. The display substrate 101 may support various elements arranged thereon. In one exemplary embodiment, the display substrate 101 may be a rigid substrate including a rigid material such as glass or quartz. However, without being limited thereto, the display substrate 101 may be a flexible substrate including a flexible material such as polyimide (PI).

A buffer layer 102 may be disposed on the display substrate 101. The buffer layer 102 can prevent penetration of moisture and oxygen from the outside through the display substrate 101. The buffer layer 102 may include one of a silicon nitride (SiNx) film, a silicon oxide ($SiO_2$) film and an oxynitride (SiOxNy) film.

A semiconductor layer 105 may be disposed on the buffer layer 102. The semiconductor layer 105 forms a channel of a thin film transistor. The semiconductor layer 105 is disposed in each pixel of the display area DA, and may be disposed in the non-display area NA in some cases. The semiconductor layer 105 may include a source/drain region and an active region. The semiconductor layer 105 may include polycrystalline silicon.

A first insulating layer 111 may be disposed on the semiconductor layer 105. The first insulating layer 111 may be disposed over substantially the entire surface of the display substrate 101. The first insulating layer 111 may be a gate insulating film having a gate insulating function. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, and titanium oxide, alone or in combination with each other.

A first conductive layer 120 may be disposed on the first insulating layer 111. The first conductive layer 120 may include a gate electrode GE of a thin film transistor TFT, a first electrode CE1 of a storage capacitor Cst, and a connection wiring GSL. The connection wiring GSL may pass through the display area DA and the panel pad area P_PA. The first conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 120 may be a single film made of the above-mentioned material or a laminated film.

Second insulating layers 112a and 112b may be disposed on the first conductive layer 120. The second insulating layers 112a and 112b may electrically isolate the first conductive layer 120 and the second conductive layer 130 from each other. The second insulating layer 112a may be disposed substantially in the display area DA and the second insulating layer 112b may be disposed substantially in the panel pad area P_PA. The second insulating layers 112a and 112b may be selected from among the above-mentioned materials of the first insulating layer 111. In the panel pad area P_PA, the second insulating layer 112b may include a plurality of contact holes CNT partially exposing the connection wiring GSL.

A second conductive layer 130 may be disposed on the second insulating layers 112a and 112b. The second conductive layer 130 may include a second electrode CE2 of the storage capacitor Cst. The material of the second conductive layer 130 may be selected from among the above-mentioned materials of the first conductive layer 120. The first electrode CE1 of the storage capacitor Cst and the second electrode CE2 of the storage capacitor Cst may form a capacitor through the second insulating layers 112a and 112b.

A third insulating layer 113 may be disposed on the second conductive layer 130. The third insulating layer 113 may include at least one of the above-mentioned materials of the first insulating layer 111. In some exemplary embodiments, the third insulating layer 113 may include an organic insulating material. The organic insulating material may be selected from exemplary materials of a first via layer VIA1 to be described later.

A third conductive layer 140 may be disposed on the third insulating layer 113. The third conductive layer 140 may include a source electrode SE, a drain electrode DE, a high-potential voltage electrode ELVDDE and a signal wiring PAD. The third conductive layer 140 may include at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 140 may be a single film made of the above-mentioned material. However, without being limited thereto, the third conductive layer 140 may be a laminated film. For example, the signal wirings PAD may be formed of a laminated structure of Ti/Al/Ti, Mo/Al/Mo, Mo/AlGe/Mo, Ti/Cu or the like. In one exemplary embodiment, the third conductive layer 140 may be formed to include Ti/Al/Ti.

The signal wiring PAD of the third conductive layer 140 may be disposed to overlap the connection wiring GSL of the first conductive layer 120 in the thickness direction and electrically connected to the connection wiring GSL through a contact hole CNT of the second insulating layer 112b.

A first via layer VIA1 may be disposed on the third conductive layer 140. The first via layer VIA1 may include an organic insulating material. The organic insulating material may include at least one of acrylic resin, epoxy resin, phenolic resin, polyamide resin, polyimide resin, unsaturated polyester resin, polyphenylene resin, polyphenylene sulfide resin, and benzocyclobutene (BCB).

Upper structures of the third conductive layer 140 and the third insulating layer 113 may be removed or omitted from a partial region of the signal wiring PAD on the panel pad area P_PA. Thus, the omitted or removed structures may expose the signal wiring PAD disposed in the panel pad area P_PA.

The first circuit board 300 may further include a lead wiring LE on one surface of the first circuit area CA1 of the printed base film 310, and a circuit lead wiring C_LE on one surface of the third circuit area CA3. The lead wiring LE is connected to the signal wiring PAD. In one exemplary embodiment, the lead wiring LE may be directly connected to the upper surface of the exposed signal wiring PAD. For example, the lead wiring LE may be ultrasonically bonded to the signal wiring PAD.

The ultrasonic bonding may be performed through an ultrasonic device 700. The ultrasonic device 700 may include a vibration generating unit 710, a vibration unit 720 connected to the vibration generating unit 710, a pressing unit 730 for amplifying the vibration amplitude of the vibration unit 720, and a vibration transmitting unit 740 connected to the vibration unit 720.

The vibration generating unit 710 may convert electrical energy into vibrational energy. The vibration unit 720 may vibrate with the vibrational energy converted by the vibration generating unit 710. The vibration unit 720 may vibrate with a predetermined amplitude in a predetermined vibration direction. The vibration unit 720 may amplify the amplitude in a direction parallel to the vibration direction through the pressing unit 730 connected to the vibration unit 720. The vibration transmitting unit 740 may transmit the vibration of the vibration unit 720 to an ultrasonic bonding object. A supporter 750 may fix the upper surface and the lower surface of the vibration unit 720 to prevent the vibration unit 720 and the vibration transmitting unit 740 from moving up and down due to the vibration.

In one exemplary embodiment, the ultrasonic device 700 is in contact with the other surface of the first circuit board 300 and maintains a constant pressure state in a downward direction such that the vibration transmitting unit 740 effectively transmits the vibration to the first circuit board 300. In this case, as shown in FIG. 2, the ultrasonic bonding may be performed while the vibration transmitting unit 740 of the ultrasonic device 700 overlaps the entire area of the first circuit board 300 disposed therebelow.

The ultrasonic device 700 may vibrate in a predetermined vibration direction to vibrate the lead wiring LE in the predetermined vibration direction. However, in this case, the signal wiring PAD may vibrate in the vibration direction by the vibration transmitted through the lead wiring LE, but the amplitude of the vibration may be small. Therefore, the vibration amplitude of the vibration transmitting unit 740 in the vibration direction may be regarded as being substantially equal to a distance in which the lead wiring LE has moved in the vibration direction on the signal wiring PAD. In one exemplary embodiment, the vibration direction may be the second direction DR2. That is, the vibration direction may extend in a direction along the long sides of the signal wiring PAD and the lead wiring LE.

When the lead wiring LE is ultrasonically vibrated on one surface of the signal wiring PAD, a predetermined frictional force is generated at an interface between one surface of the signal wiring PAD and one surface of the lead wiring LE, and frictional heat may be generated due to the frictional force. As shown in FIG. 2, if the frictional heat is sufficient to melt the materials of the signal wiring PAD and the lead wiring LE, a pad melting region PADb adjacent to the lead wiring LE of the signal wiring PAD and a lead melting region LEb adjacent to the signal wiring PAD of the lead wiring LE may be fused together during melting. In other words, the signal wiring PAD may include a pad non-melting region PADa and the pad melting region PADb. Further, the lead wiring LE may include a lead non-melting region LEa and the lead melting region LEb.

The pad non-melting region PADa may be a region containing only the material of the signal wiring PAD. The lead non-melting region LEa may be a region containing only the material of the lead wiring LE.

The pad melting region PADb may be a region in which the material of the lead wiring LE is diffused, and the material of the signal wiring PAD and the material of the lead wiring LE are mixed. The lead melting region LEb may be a region in which the material of the signal wiring PAD is diffused, and the material of the lead wiring LE and the material of the signal wiring PAD are mixed.

In the pad melting region PADb and the lead melting region LEb, the signal wiring PAD and the lead wiring LE can be bonded to each other through solidification. The interface between the signal wiring PAD and the lead wiring LE, i.e., the interface between the pad melting region PADb and the lead melting region LEb, may have an irregular, such as a non-flat, shape.

For example, the lead wiring LE may include a metal material. The lead wiring LE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In the illustrated exemplary embodiment, the lead wiring LE may include copper (Cu) and gold (Au). That is, the lead wiring LE may be made of copper (Cu) disposed on the printed base film 310 and gold (Au) disposed on the copper (Cu), but is not limited thereto.

In the display device 1, in order to leave a marker for inspecting whether the surface bonding force between the signal wiring PAD and the lead wiring LE is acceptable after the ultrasonic bonding process, as shown in FIG. 2, a plurality of inorganic patterns 180 are disposed on one surface of the signal wiring PAD facing the lead wiring LE. A detailed description thereof will be given later.

A fourth conductive layer 150 may be disposed on the first via layer VIA1. The fourth conductive layer 150 may include a data line DL, a connection electrode CNE, and a high-potential voltage wiring ELVDDL. The data line DL may be electrically connected to the source electrode SE of the thin film transistor TFT through a contact hole passing through the first via layer VIA1. The connection electrode CNE may be electrically connected to the drain electrode DE of the thin film transistor TFT through a contact hole passing through the first via layer VIA1. The high-potential voltage wiring ELVDDL may be electrically connected to the high-potential voltage electrode ELVDDE through a contact hole passing through the first via layer VIA1. The fourth conductive layer 150 may include a material selected from the above-exemplified materials of the third conductive layer 140.

A second via layer VIA2 is disposed on the fourth conductive layer 150. The second via layer VIA2 may include at least one of the above-exemplified materials of the first via layer VIA1.

An anode electrode ANO is disposed on the second via layer VIA2. The anode electrode ANO may be electrically connected to the connection electrode CNE through a contact hole passing through the second via layer VIA2.

A bank layer BANK may be disposed on the anode electrode ANO. The bank layer BANK may include a contact hole exposing the anode electrode ANO. The bank layer BANK may be formed of an organic insulating material or an inorganic insulating material. For example, the bank layer BANK may include at least one of a photoresist, a polyimide resin, an acrylic resin, a silicon compound, a polyacrylic resin and the like.

An organic light emitting layer EL may be disposed on the upper surface of the anode electrode ANO and in an opening of the bank layer BANK. A cathode electrode CAT is disposed on the organic light emitting layer EL and the bank layer BANK. The cathode electrode CAT may be a common electrode disposed over a plurality of pixels.

A thin film encapsulation layer 170 is disposed on the cathode electrode CAT. The thin film encapsulation layer 170 may cover the cathode electrode CAT and protect the organic light emitting layer EL disposed therebelow. The thin film encapsulation layer 170 may be a laminated film in which inorganic and organic films are alternately laminated. For example, the thin film encapsulation layer 170 may include a first inorganic encapsulation film 171, an organic encapsulation film 172 and a second inorganic encapsulation film 173 which are sequentially stacked.

The laminated structure and shape of the connection wiring GSL and the signal wiring PAD in the panel pad area P_PA may be modified.

For example, in some exemplary embodiments, the connection wiring GSL may include a plurality of patterns, and the signal wiring PAD disposed on the connection wiring GSL may have surface irregularities due to a height difference of the patterns of the connection wiring GSL.

In some exemplary embodiments, an auxiliary signal wiring of the second conductive layer 130 may be further disposed between the connection wiring GSL and the signal wiring PAD. In this case, the planar size of the auxiliary signal wiring may be smaller than the planar size of the signal wiring PAD. The signal wiring PAD, the auxiliary signal wiring and the connection wiring GSL may overlap each other in the thickness direction to be electrically connected.

Further, in some exemplary embodiments, the connection wiring GSL may be formed of the second conductive layer 130, and the signal wiring PAD may be formed of the fourth conductive layer 150.

Referring to FIG. 3, the signal wiring PAD is provided plurally, and a plurality of signal wirings PAD may be arranged each extending in the first direction DR1. The plurality of signal wirings PAD may include, for example, power source signal wirings, data signal wirings, panel dummy wirings and the like. The first direction DR1 may be a direction from the end of the panel pad area P_PA toward the display area DA. The second direction DR2 refers to a direction intersecting the first direction DR1.

Further, the lead wiring LE arranged in the first circuit area CA1 may be provided plurally, and may be arranged each extending in the first direction DR1. The plurality of lead wirings LE may include power source lead wirings, data lead wirings, dummy lead wirings and the like.

Referring to FIG. 4, the plurality of signal wirings PAD may be connected to the plurality of lead wirings LE. For example, the signal wirings PAD may be directly connected to the lead wirings LE and may be ultrasonically bonded. The first circuit area CA1 of FIG. 4 inverted by 180 degrees is attached to the panel pad area P_PA of FIG. 3 in the thickness direction.

Hereinafter, a configuration of the panel pad area P_PA including the plurality of inorganic patterns 180 disposed on the signal wiring PAD will be described in detail.

Figure 5:
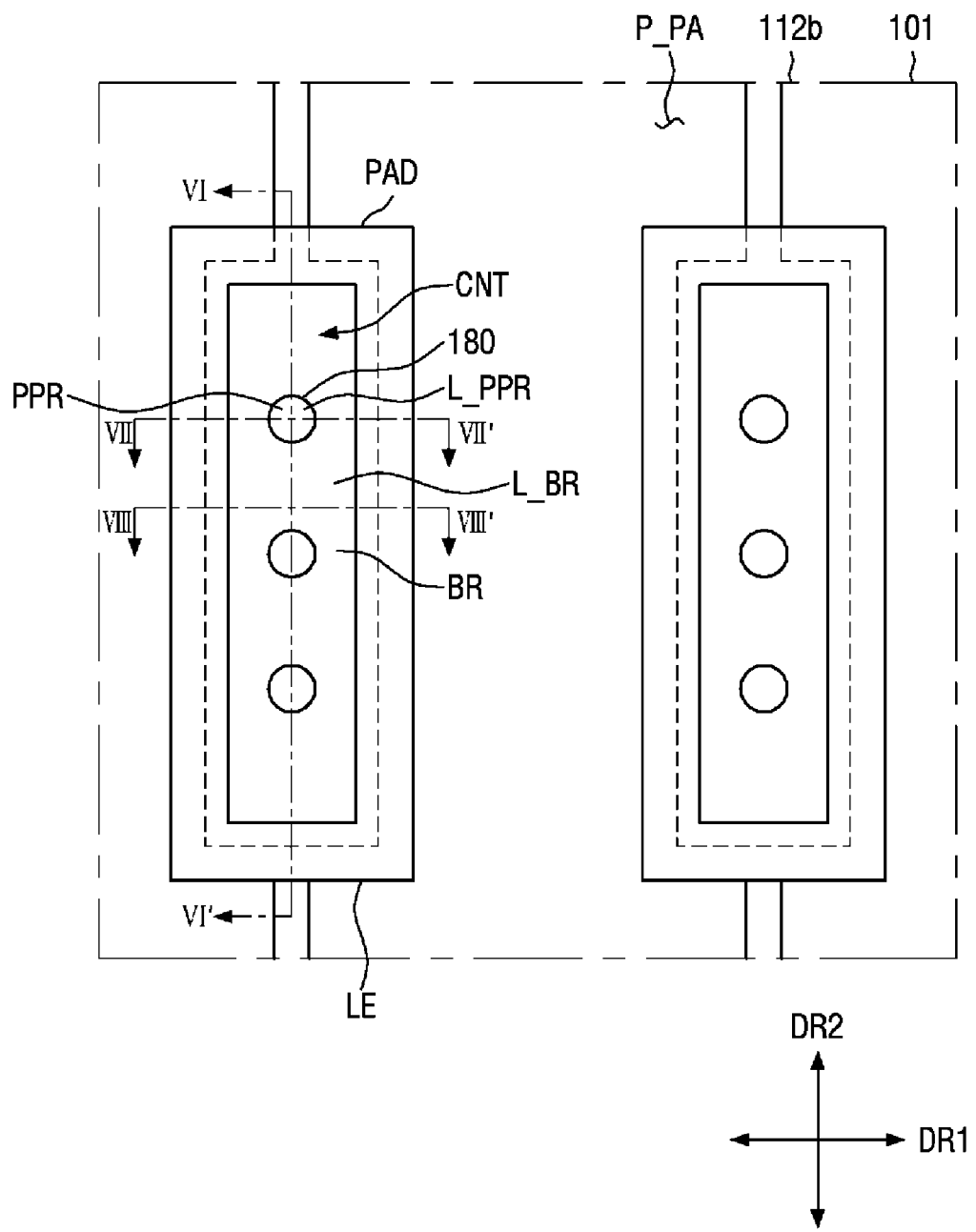
FIG. 5 is an enlarged plan view of a portion of FIG. 4.
Figure 6:
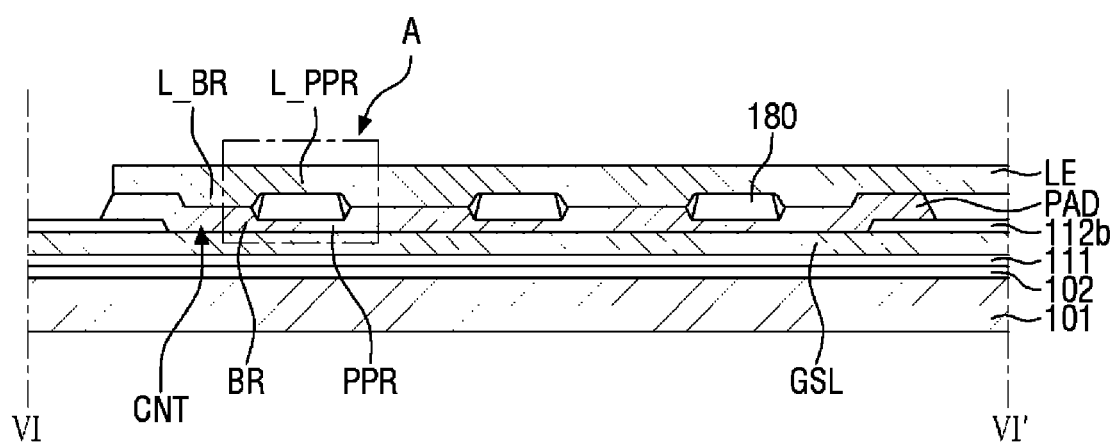
FIG. 6 is a cross-sectional view taken along line VI-VI' of FIG. 5.
Figure 7:
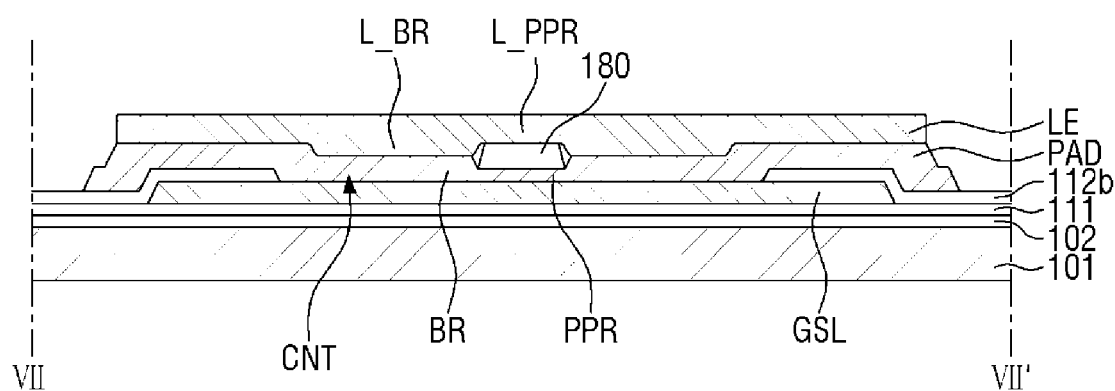
FIG. 7 is a cross-sectional view taken along line VII-VII' of FIG. 5.
Figure 8:
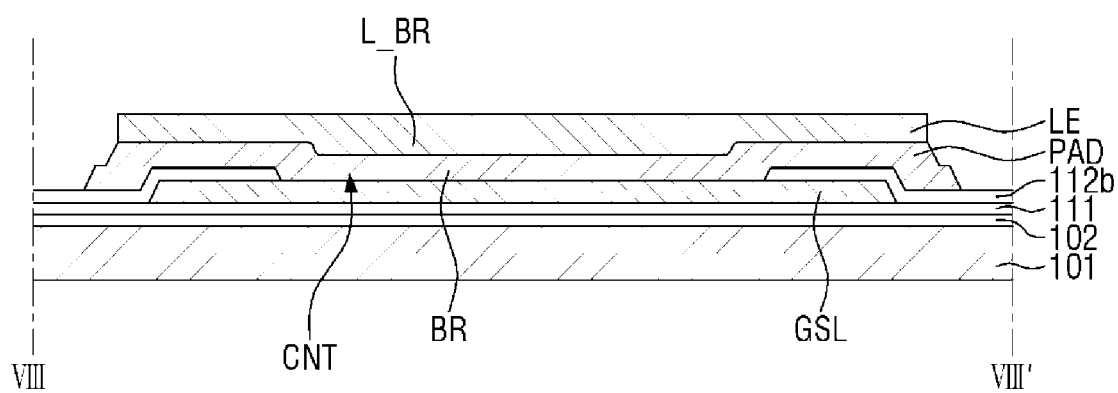
FIG. 8 is a cross-sectional view taken along line VIII-VIII' of FIG. 5.
Figure 9:
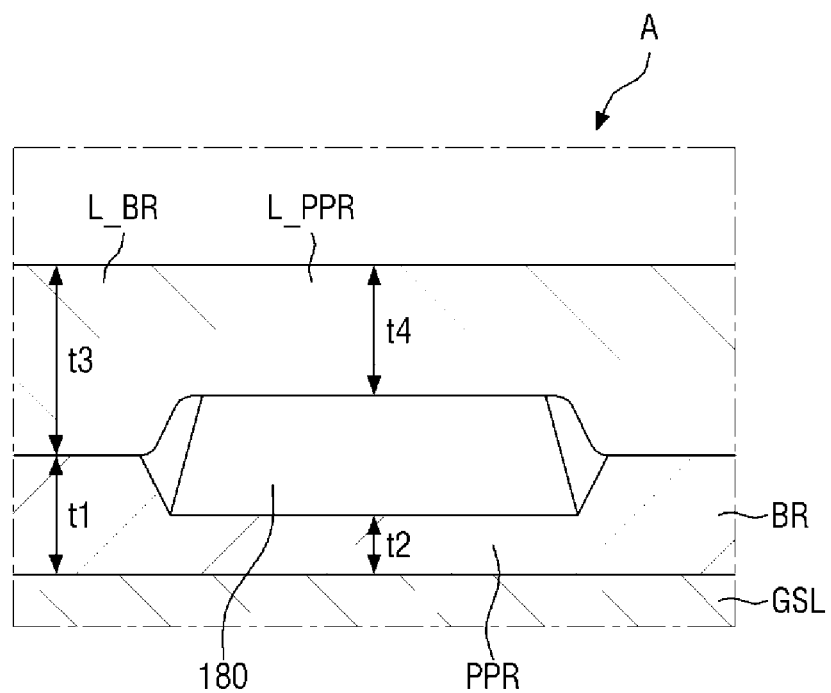
FIG. 9 is an enlarged cross-sectional view of region A of FIG. 5.
Figure 10:
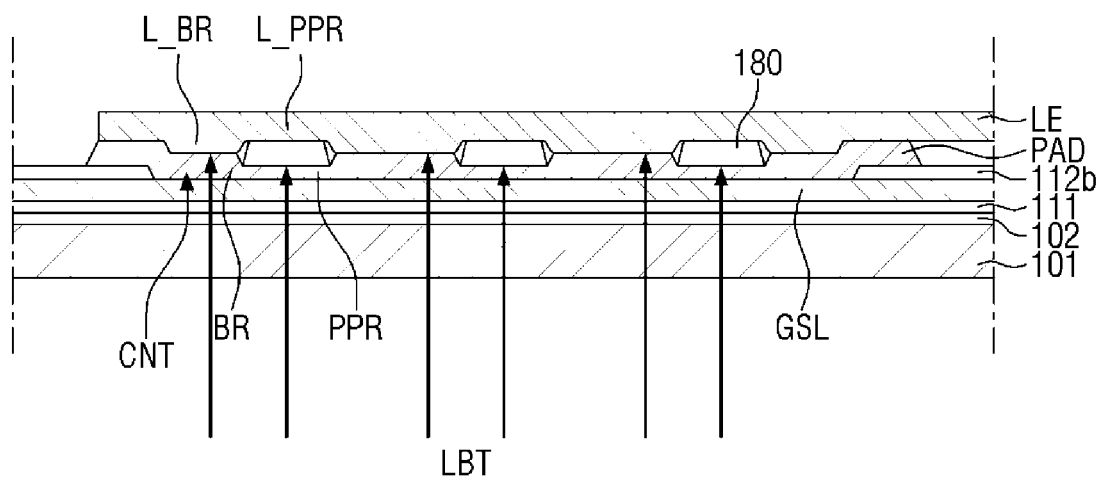
FIG. 10 is a cross-sectional view illustrating an inspection process to determine whether bonding between a signal wiring and a lead wiring is acceptable or defective by irradiating the signal wiring with bonding inspection light.

FIG. 5 is an enlarged plan view of FIG. 4, and FIG. 6 is a cross-sectional view taken along line VI-VI' of FIG. 5. FIG. 7 is a cross-sectional view taken along line VII-VII' of FIG. 5, and FIG. 8 is a cross-sectional view taken along line VIII-VIII' of FIG. 5. FIG. 9 is an enlarged cross-sectional view of region A of FIG. 5, and FIG. 10 is a cross-sectional view illustrating an inspection on whether bonding between the signal wiring and the lead wiring is acceptable or defective by irradiating the signal wiring with bonding inspection light.

Referring to FIGS. 5 to 10, the connection wiring GSL may be disposed from the display area DA to the panel pad area P_PA and may have a width which increases in the first direction DR1 in a plan view in a region overlapping the signal wiring PAD of the panel pad area P_PA.

The second insulating layer 112b may include a contact hole CNT that covers an edge portion of the connection wiring GSL and exposes a central portion of the connection wiring GSL. Although FIG. 5 illustrates that the contact hole CNT of the second insulating layer 112b has a rectangular shape in a plan view, the exemplary embodiments are not limited thereto, and the planar shape of the contact hole CNT may be modified variously.

The signal wiring PAD may be disposed on the second insulating layer 112b and the connection wiring GSL. The signal wiring PAD may be electrically connected to the connection wiring GSL through the contact hole CNT.

The planar size of the signal wiring PAD may be larger than the planar size of the connection wiring GSL. That is, as shown in FIG. 5, the signal wiring PAD may include a first short side edge located above the short side edge located at the upper end of the connection wiring GSL in the second direction DR2, a second short side edge located below the short side edge located at the lower end of the connection wiring GSL in the second direction DR2, a first long side edge located on the left side of the long side edge located at the left end of the connection wiring GSL in the first direction DR1, and a second long side edge located on the right side of the long side edge located at the right end of the connection wiring GSL in the first direction DR1.

The signal wiring PAD may include a first surface facing the connection wiring GSL, and a second surface opposite to the first surface. The first surface of the signal wiring PAD may be in direct contact with the second insulating layer 112b and the connection wiring GSL. The second surface of the signal wiring PAD may be in direct contact with the lead wiring LE and the inorganic patterns 180.

The second surface of the signal wiring PAD disposed to overlap the second insulating layer 112b may protrude in the thickness direction further than the second surface of the signal wiring PAD disposed so as not to overlap the second insulating layer 112b.

The plurality of inorganic patterns 180 may be disposed on the second surface of the signal wiring PAD. The inorganic patterns 180 may be disposed between the lead wiring LE and the signal wiring PAD. The inorganic patterns 180 may be located within the signal wiring PAD in a plan view and may be surrounded by the second insulating layer 112b in a plan view. The inorganic patterns 180 may be completely surrounded by the second insulating layer 112b in a plan view and may be disposed to overlap the contact hole CNT of the second insulating layer 112b in the thickness direction.

The plurality of inorganic patterns 180 may be arranged along the second direction DR2. FIG. 5 illustrates that the plurality of inorganic patterns 180 are arranged in one row along the second direction DR2. However, the exemplary embodiments are not limited thereto. For example, the plurality of inorganic patterns 180 may be arranged in one row, arranged in a zigzag manner along the second direction DR2, or may be randomly arranged.

The planar shape of the inorganic pattern 180 may be a circle or an ellipse. The planar shape of the inorganic pattern 180 may be different depending on the pattern shape of a mask used in a deposition process of the inorganic patterns 180.

The inorganic patterns 180 may include a material having a higher rigidity than the signal wiring PAD disposed therebelow, and the lead wiring LE disposed thereon. For example, the inorganic patterns 180 may include an inorganic material. The inorganic material may include, for example, an inorganic insulating material, or a metal material. Examples of the inorganic insulating material may include silicon oxide, silicon nitride, silicon oxynitride, aluminum oxide, tantalum oxide, hafnium oxide, zirconium oxide and titanium oxide. As an example of the metal material, tungsten (W) may be mentioned.

Since the inorganic patterns 180 include a material having a higher rigidity than the signal wiring PAD disposed therebelow and the lead wiring LE disposed thereon, as will be described later, the lead wiring LE and the signal wiring PAD in the region overlapping the inorganic patterns 180 may be recessed in a direction opposite to the inorganic patterns 180 after the ultrasonic bonding process. It is possible to inspect whether the bonding of the signal wiring PAD and the lead wiring LE is acceptable or defective through the recessed shape of the signal wiring PAD.

The lead wiring LE may be disposed on the signal wiring PAD and the inorganic patterns 180. The lead wiring LE may be in direct contact with the second surface of the signal wiring PAD and the inorganic patterns 180. The lead wiring LE may include a third surface facing a display surface and a fourth surface opposite to the third surface and facing the signal wiring PAD.

The shape of the signal wiring PAD and the lead wiring LE in accordance with the inorganic patterns 180 will be described in detail. The signal wiring PAD may include a pad pressing portion PPR which overlaps the inorganic patterns 180 in the thickness direction, and a pad bonding portion BR which does not overlap the inorganic patterns 180 in the thickness direction. The pad pressing portion PPR of the signal wiring PAD may be completely surrounded by the pad bonding portion BR of the signal wiring PAD in a plan view.

Further, the lead wiring LE may include a lead pressing portion L_PPR which overlaps the inorganic patterns 180 in the thickness direction, and a lead bonding portion L_BR which does not overlap the inorganic patterns 180 in the thickness direction.

The pad bonding portion BR of the signal wiring PAD may be coupled to the lead bonding portion L_BR of the lead wiring LE. The pad bonding portion BR of the signal wiring PAD may be directly surface-bonded to the lead bonding portion L_BR of the lead wiring LE. In other words, they may be ultrasonically bonded.

On the other hand, since the pad pressing portion PPR of the signal wiring PAD and the lead pressing portion L_PPR of the lead wiring LE are spaced apart from each other with the inorganic patterns 180 interposed therebetween, they may not be coupled together.

By the ultrasonic bonding process, the second surface and the fourth surface of the pad pressing portion PPR of the signal wiring PAD and the lead pressing portion L_PPR of the lead wiring LE may be recessed in a direction opposite to the inorganic patterns 180 by the inorganic patterns 180 having a higher rigidity than them.

Referring to FIG. 6, during the ultrasonic bonding process, when the ultrasonic device 700 described above with reference to FIG. 2 is brought into contact with the upper portion of the lead wiring LE to apply ultrasonic vibration, both the lead pressing portion L_PPR and the lead bonding portion L_BR of the lead wiring LE receive a downward force and may apply a force to the signal wiring PAD in a downward direction. However, the pad pressing portion PPR of the signal wiring PAD overlapping the inorganic patterns 180 may be recessed further downward than the pad bonding portion BR of the signal wiring PAD due to the inorganic patterns 180 located below the lead pressing portion L_PPR of the lead wiring LE. That is, the pad pressing portion PPR of the signal wiring PAD may have a recessed pattern in a region overlapping the inorganic patterns 180 that can act as a marker.

Referring to FIG. 9, the height of the second surface of the pad bonding portion BR of the signal wiring PAD may be greater than the height of the second surface of the pad pressing portion PPR of the signal wiring PAD. That is, a first thickness t1 from the first surface of the signal wiring PAD to the second surface of the pad bonding portion BR may be greater than a second thickness t2 from the first surface of the signal wiring PAD to the second surface of the pad pressing portion PPR.

Further, the height of the fourth surface of the lead bonding portion L_BR of the lead wiring LE may be greater than the height of the fourth surface of the lead pressing portion L_PPR of the lead wiring LE. That is, a third thickness t3 from the third surface of the lead wiring LE to the fourth surface of the lead bonding portion L_BR may be greater than a fourth thickness t4 from the third surface of the lead wiring LE to the fourth surface of the lead pressing portion L_PPR.

The sum of the difference between the first thickness t1 and the second thickness t2 and the difference between the third thickness t3 and the fourth thickness t4 may be equal to the thickness of the inorganic pattern 180.

Whether the bonding of the signal wiring PAD and the lead wiring LE is acceptable or defective may be determined by the degree of bonding between the pad bonding portion BR of the signal wiring PAD and the lead bonding portion L_BR of the lead wiring LE after the ultrasonic device 700 described above applies an appropriate force to the lead wiring LE and the signal wiring PAD disposed therebelow.

In other words, as the ultrasonic device 700 applies a larger force to the lead wiring LE and the signal wiring PAD disposed therebelow, a region where the pad bonding portion BR of the signal wiring PAD is surface-bonded to the lead bonding portion L_BR of the lead wiring LE may increase. At the same time, the difference between the first thickness t1 from the first surface of the signal wiring PAD to the second surface of the pad bonding portion BR and the second thickness t2 from the first surface of the signal wiring PAD to the second surface of the pad pressing portion PPR may increase.

However, it is difficult to visually observe the region where the pad bonding portion BR of the signal wiring PAD is surface-bonded to the lead bonding portion L_BR of the lead wiring LE, and even when observed with naked eyes, the criterion for determining whether the bonding is acceptable or defective may not be clear.

In the display device 1 according to the exemplary embodiment, the ultrasonic bonding process is performed while the inorganic patterns 180 having a higher rigidity than the lead wiring LE and the signal wiring PAD are disposed between the lead wiring LE and the signal wiring PAD. When the difference between the first thickness t1 from the first surface of the signal wiring PAD to the second surface of the pad bonding portion BR and the second thickness t2 from the first surface of the signal wiring PAD to the second surface of the pad pressing portion PPR is equal to or greater than a reference thickness difference, it may be determined that the pad bonding portion BR of the signal wiring PAD and the lead bonding portion L_BR of the lead wiring LE have secured a surface-bonding region having a reference value of acceptable bonding or more.

Referring to FIG. 10, by irradiating bonding inspection light LBT to the second surface of the signal wiring PAD, it is possible to inspect whether the bonding between the signal wiring PAD and the lead wiring LE is acceptable or defective.

The bonding inspection light LBT is irradiated from a bonding inspection apparatus. The bonding inspection apparatus may be a differential camera or a differential scope for emitting the bonding inspection light LBT or the like.

The bonding inspection apparatus may irradiate the bonding inspection light LBT over the second surface of the signal wiring PAD, receive the bonding inspection light LBT reflected from the second surface, and observe the overall surface roughness of the second surface of the signal wiring PAD.

As shown in FIGS. 9 and 10, the bonding inspection apparatus may calculate the difference between the first thickness t1 from the first surface of the signal wiring PAD to the second surface of the pad bonding portion BR and the second thickness t2 from the first surface of the signal wiring PAD to the second surface of the pad pressing portion PPR by observing the overall surface roughness of the second surface of the signal wiring PAD, and determine that the pad bonding portion BR of the signal wiring PAD and the lead bonding portion L_BR of the lead wiring LE have secured a surface-bonding region having a reference value of acceptable bonding or more when the calculated difference between the first thickness t1 and the second thickness t2 is equal to or greater than a reference thickness difference.

In other words, in the display device 1, by disposing the inorganic patterns 180 having a higher rigidity than the lead wiring LE and the signal wiring PAD between the lead wiring LE and the signal wiring PAD, it is possible to easily determine whether the bonding between the lead wiring LE and the signal wiring PAD is acceptable or defective, and it is also possible to clarify the criterion for determining whether the bonding between the lead wiring LE and the signal wiring PAD is acceptable or defective.

Hereinafter, other exemplary embodiments will be described. In the following exemplary embodiments, the same components as those of the above-described exemplary embodiment are denoted by the same reference numerals and a description thereof will be omitted or simplified to avoid redundancy.

Figure 11A:
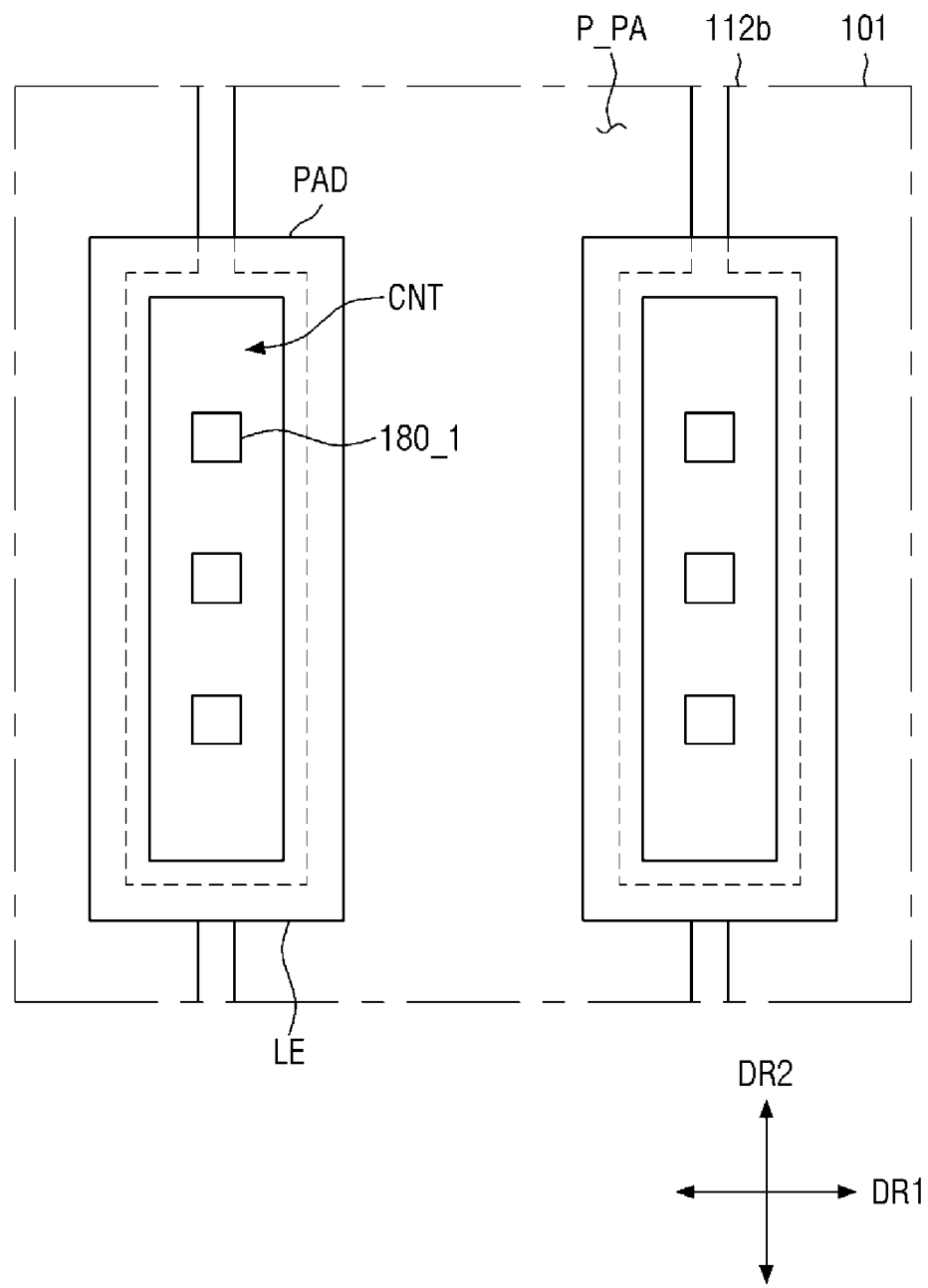
FIGS. 11A and 11B are plan views showing a schematic layout of a panel pad area of a display panel attached to a first circuit board according to another exemplary embodiment.
Figure 11B:
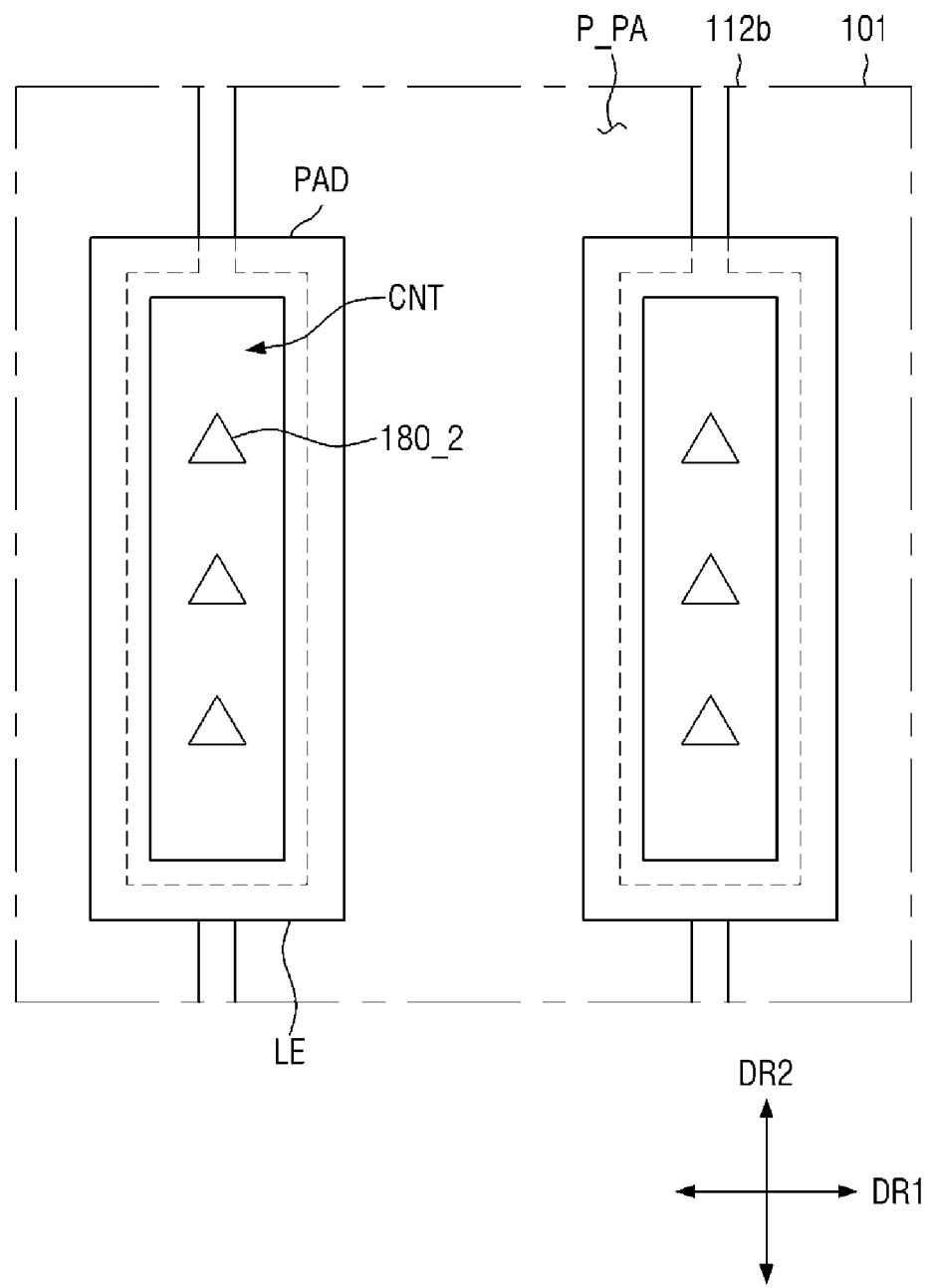

FIGS. 11A and 11B are plan views showing a schematic layout of a panel pad area of a display panel and a first circuit board attached to the panel pad area according to another exemplary embodiment.

FIGS. 11A and 11B illustrate that the planar shape of inorganic patterns 180_1 and 180_2 may be modified variously.

More specifically, as shown in FIG. 11A, the planar shape of the inorganic pattern 180_1 may be a quadrangle or a rectangle. As shown in FIG. 11B, the planar shape of the inorganic pattern 180_2 may be a triangle or an equilateral triangle.

According to the illustrated embodiment, similarly to the above-described exemplary embodiments, by disposing the inorganic patterns 180_1 and 180_2 having a higher rigidity than the lead wiring LE and the signal wiring PAD between the lead wiring LE and the signal wiring PAD, it is possible to easily determine whether the bonding between the lead wiring LE and the signal wiring PAD is acceptable or defective, and it is also possible to clarify the criterion for determining whether the bonding between the lead wiring LE and the signal wiring PAD is acceptable or defective.

Figure 12:
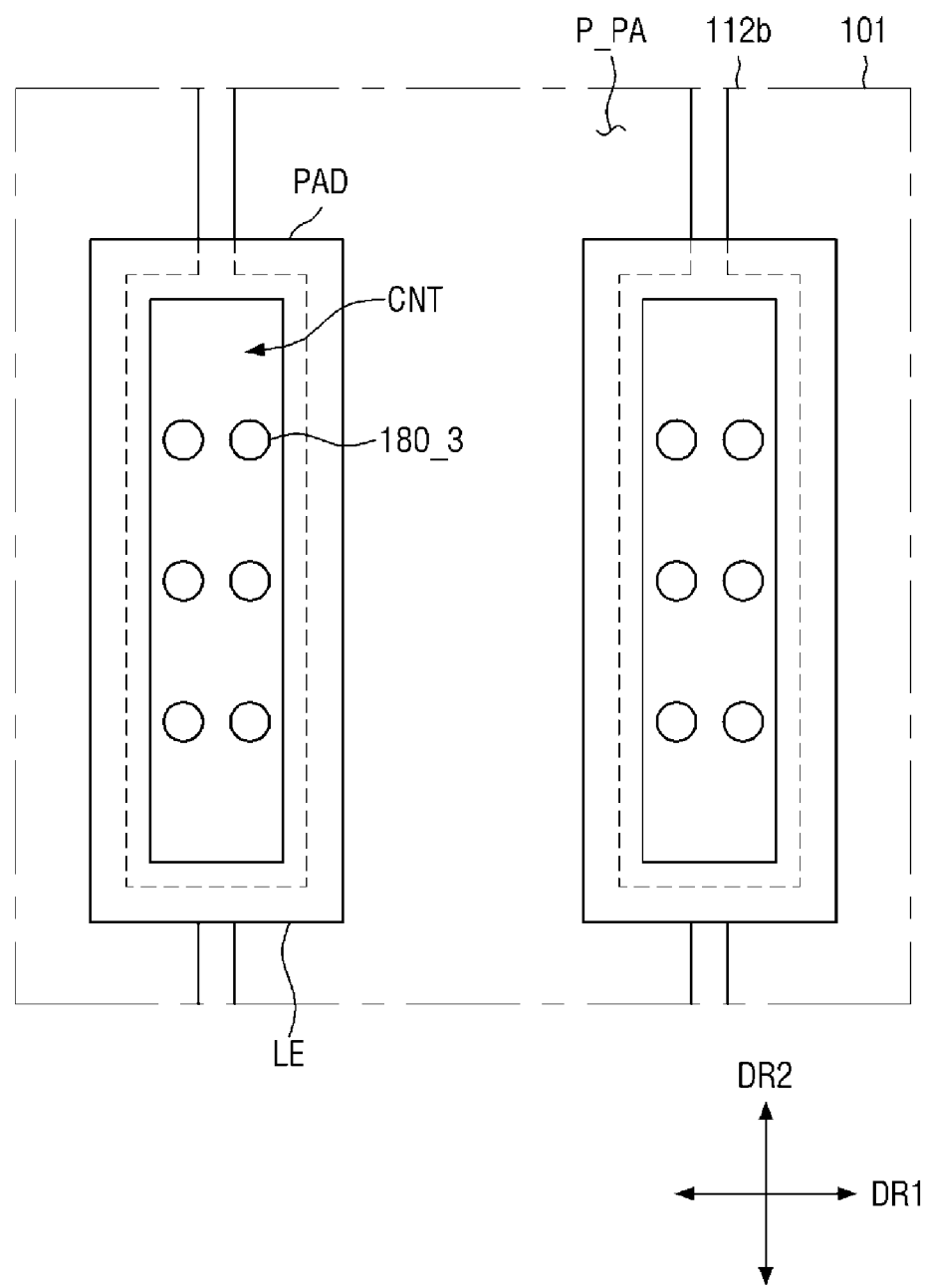
FIG. 12 is a plan view showing a schematic layout of a panel pad area of a display panel attached to a first circuit board according to still another exemplary embodiment.

FIG. 12 is a plan view showing a schematic layout of a panel pad area of a display panel and a first circuit board attached to the panel pad area according to still another exemplary embodiment.

Referring to FIG. 12, a plurality of inorganic patterns 180_3 according to the exemplary embodiment are different from the plurality of inorganic patterns 180 according to the above-described exemplary embodiment in that the inorganic patterns 180_3 are arranged in a plurality of rows.

More specifically, the plurality of inorganic patterns 180_3 according to the exemplary embodiment may be arranged in a plurality of rows. As shown in FIG. 12, the plurality of inorganic patterns 180_3 may include two rows separated from each other in the first direction DR1. However, the exemplary embodiments are not limited thereto, and the plurality of inorganic patterns 180_3 may include three or more rows separated from each other in the first direction DR1.

According to the illustrated embodiment, similarly to the above-described exemplary embodiments, by disposing the plurality of inorganic patterns 180_3 having a higher rigidity than the lead wiring LE and the signal wiring PAD between the lead wiring LE and the signal wiring PAD, it is possible to easily determine whether the bonding between the lead wiring LE and the signal wiring PAD is acceptable or defective, and it is also possible to clarify the criterion for determining whether the bonding between the lead wiring LE and the signal wiring PAD is acceptable or defective.

Figure 13:
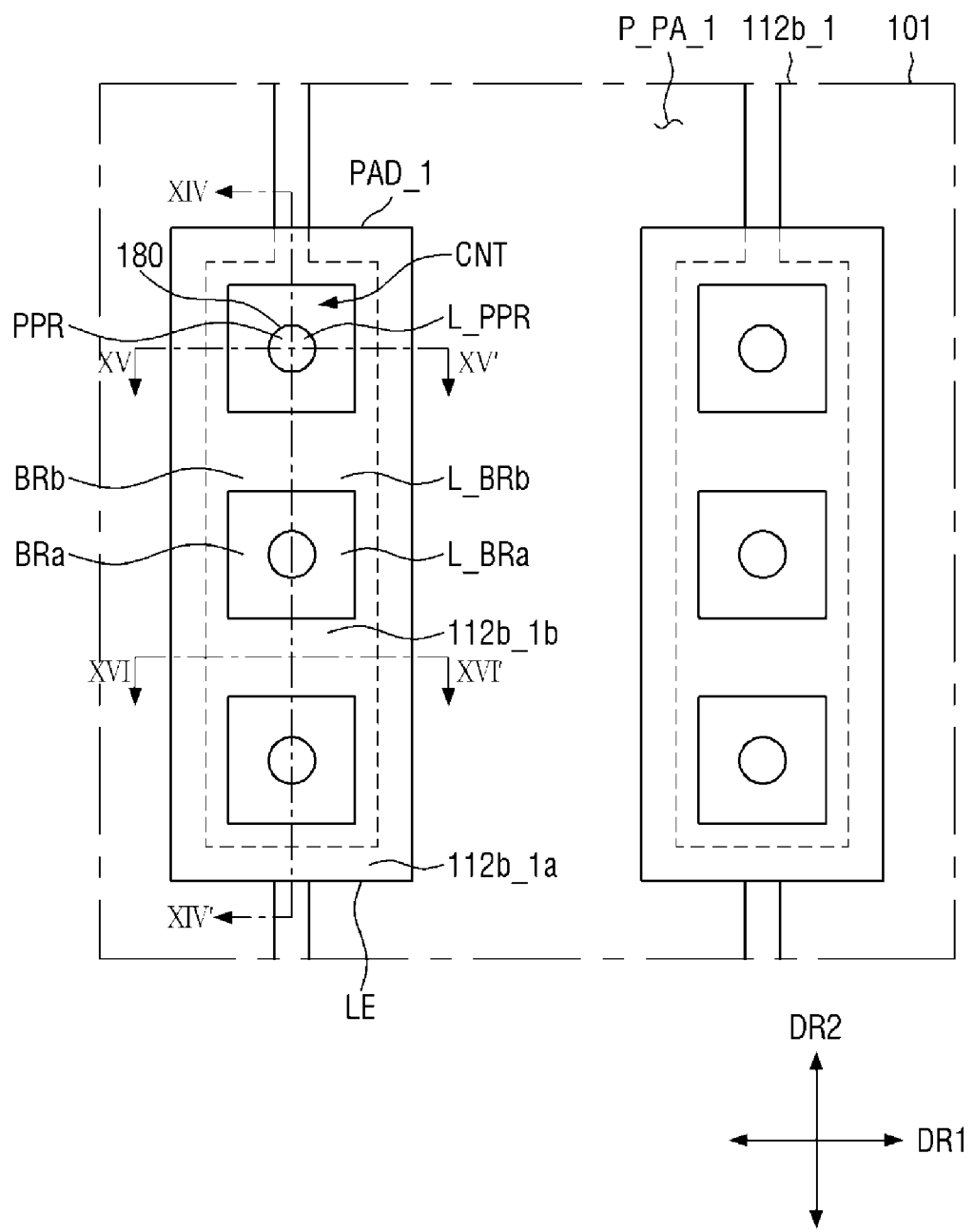
FIG. 13 is a plan view showing a schematic layout of a panel pad area of a display panel attached to a first circuit board according to still another exemplary embodiment.
Figure 14:
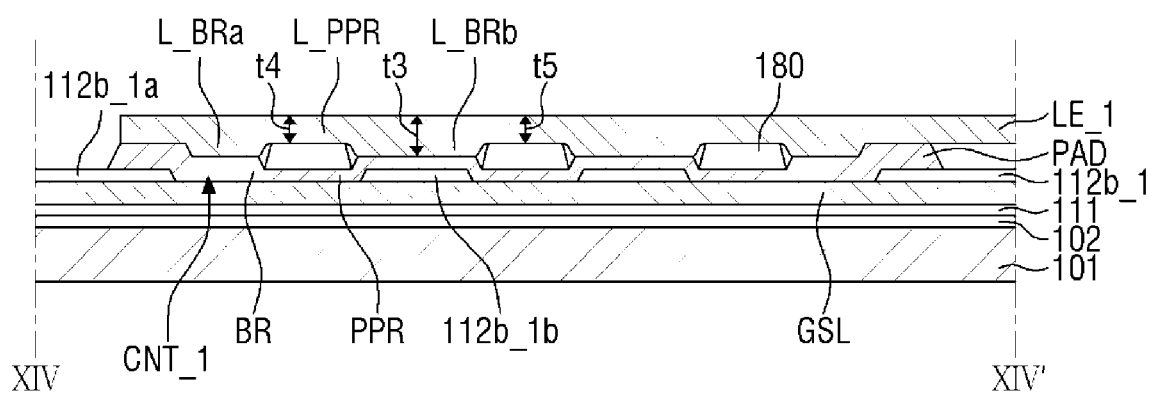
FIG. 14 is a cross-sectional view taken along line XIV-XIV of FIG. 13.
Figure 15:
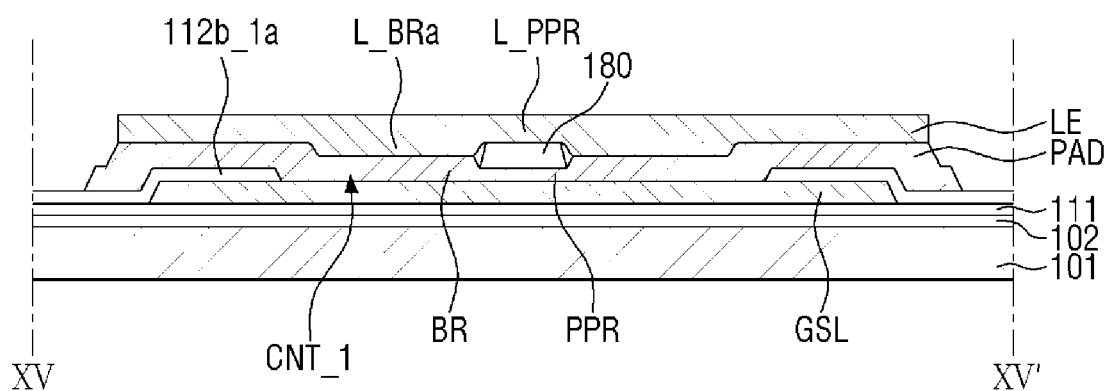
FIG. 15 is a cross-sectional view taken along line XV-XV' of FIG. 13.
Figure 16:
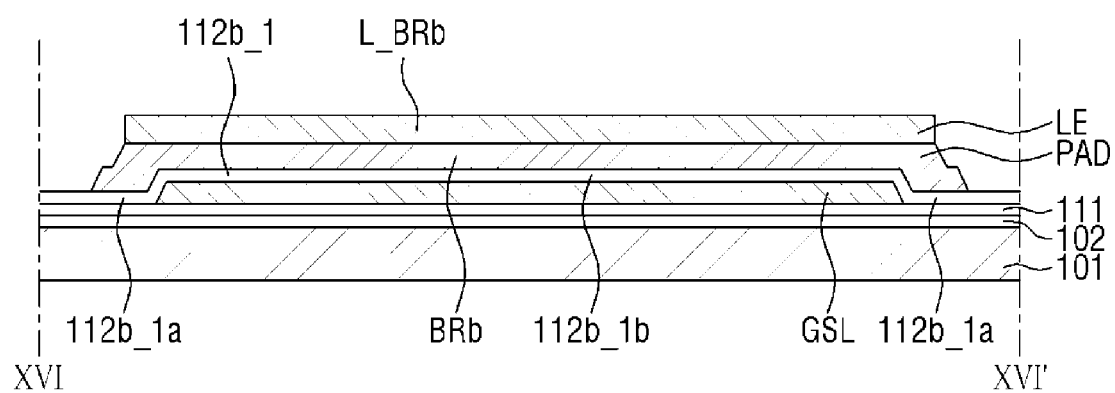
FIG. 16 is a cross-sectional view taken along line XVI-XVI' of FIG. 13.

FIG. 13 is a plan view showing a schematic layout of a panel pad area of a display panel and a first circuit board attached to the panel pad area according to still another exemplary embodiment. FIG. 14 is a cross-sectional view taken along line XIV-XIV' of FIG. 13. FIG. 15 is a cross-sectional view taken along line XV-XV' of FIG. 13, and FIG. 16 is a cross-sectional view taken along line XVI-XVI' of FIG. 13.

Referring to FIGS. 13 to 16, a panel pad area P_PA_1 according to the illustrated embodiment differs from the panel pad area P_PA according to the above-described exemplary embodiments in that a second insulating layer 112b_1 includes a plurality of patterns.

More specifically, in the panel pad area P_PA_1 according to the illustrated embodiment, the second insulating layer 112b_1 may include a plurality of patterns. That is, the second insulating layer 112b_1 may include a main insulation pattern 112b1a which is substantially the same as the second insulating layer 112b shown in FIG. 5, and a bridge insulation pattern 112b_1b which connects the main insulation patterns 112b_1a disposed on both long sides.

The main insulation pattern 112b_1a may cover an edge portion of the connection wiring GSL. That is, the main insulation pattern 112b_1a may include a first portion covering the left long side edge of the connection wiring GSL in the first direction DR1, a second portion covering the right long side edge of the connection wiring GSL in the first direction DR1, a third portion covering the upper short side edge of the connection wiring GSL in the second direction DR2, and a fourth portion covering the lower short side edge of the connection wiring GSL in the second direction DR2. The bridge insulation pattern 112b_1b may physically connect the first portion and the second portion. That is, the bridge insulation pattern 112b_1b may be disposed between the first portion and the second portion.

Although FIG. 13 illustrates that three bridge insulation patterns 112b_1b are arranged in the second direction DR2, the exemplary embodiments are not limited thereto, and the number of the bridge insulation patterns 112b_1b may be one, two, or four or more.

The second insulating layer 112b_1 may include contact holes CNT_1 in the third portion of the main insulation pattern 112b_1a, the bridge insulation pattern 112b_1b adjacent to the third portion, a portion surrounded by the second portion and the first portion, the fourth portion of the main insulation pattern 112b_1a, the bridge insulation pattern 112b_1b adjacent to the third portion, the bridge insulation pattern 112b_1b adjacent to the portion surrounded by the second portion and the first portion, and a portion surrounded by the second portion and the first portion, respectively. Since the contact hole CNT_1 according to the illustrated embodiment of FIG. 13 has the same function as the contact hole CNT according to the exemplary embodiment of FIG. 5, a repetitive description will be omitted to avoid redundancy.

The plurality of inorganic patterns 180 may be disposed to overlap the contact holes CNT_1, respectively, in the thickness direction and may be disposed in the contact holes CNT_1, respectively, in a plan view.

A signal wiring PAD_1 may include a first sub-pad bonding portion Bra disposed in a region which does not overlap the inorganic patterns 180 and the bridge insulation pattern 112b_1b in the thickness direction, and a second sub-pad bonding portion BRb which overlaps the bridge insulation pattern 112b_1b of a second insulating layer 112b_1 in the thickness direction. The second surface of the second sub-pad bonding portion BRb may be in direct contact with the bridge insulation pattern 112b_1b of the second insulating layer 112b_1.

The second surface of the second sub-pad bonding portion BRb of the signal wiring PAD_1 may protrude toward the display surface from the second surface of the first sub-pad bonding portion Bra of the signal wiring PAD_1.

The lead wiring LE_1 may include a first sub-lead bonding portion L_BRa disposed in a region which does not overlap the inorganic patterns 180 and the bridge insulation pattern 112b_1b in the thickness direction, and a second sub-lead bonding portion L_BRb which overlaps the bridge insulation pattern 112b_1b of the second insulating layer 112b_1 in the thickness direction.

The height of the fourth surface of the first sub-lead bonding portion L_BRa of the lead wiring LE_1 may be greater than the height of the fourth surface of the second sub-lead bonding portion L_BRb of the lead wiring LE_1. That is, a third thickness t3 from the third surface of the lead wiring LE_1 to the fourth surface of the first sub-lead bonding portion L_BRa may be greater than a fifth thickness t5 from the third surface of the lead wiring LE_1 to the fourth surface of the second sub-lead bonding portion L_BRb.

According to the illustrated embodiment, similarly to the above-described exemplary embodiments, by disposing the plurality of inorganic patterns 180 having a higher rigidity than the lead wiring LE_1 and the signal wiring PAD_1 between the lead wiring LE_1 and the signal wiring PAD_1, it is possible to easily determine whether the bonding between the lead wiring LE_1 and the signal wiring PAD_1 is acceptable or defective, and it is also possible to clarify the criterion for determining whether the bonding between the lead wiring LE_1 and the signal wiring PAD_1 is acceptable or defective.

Figure 17:
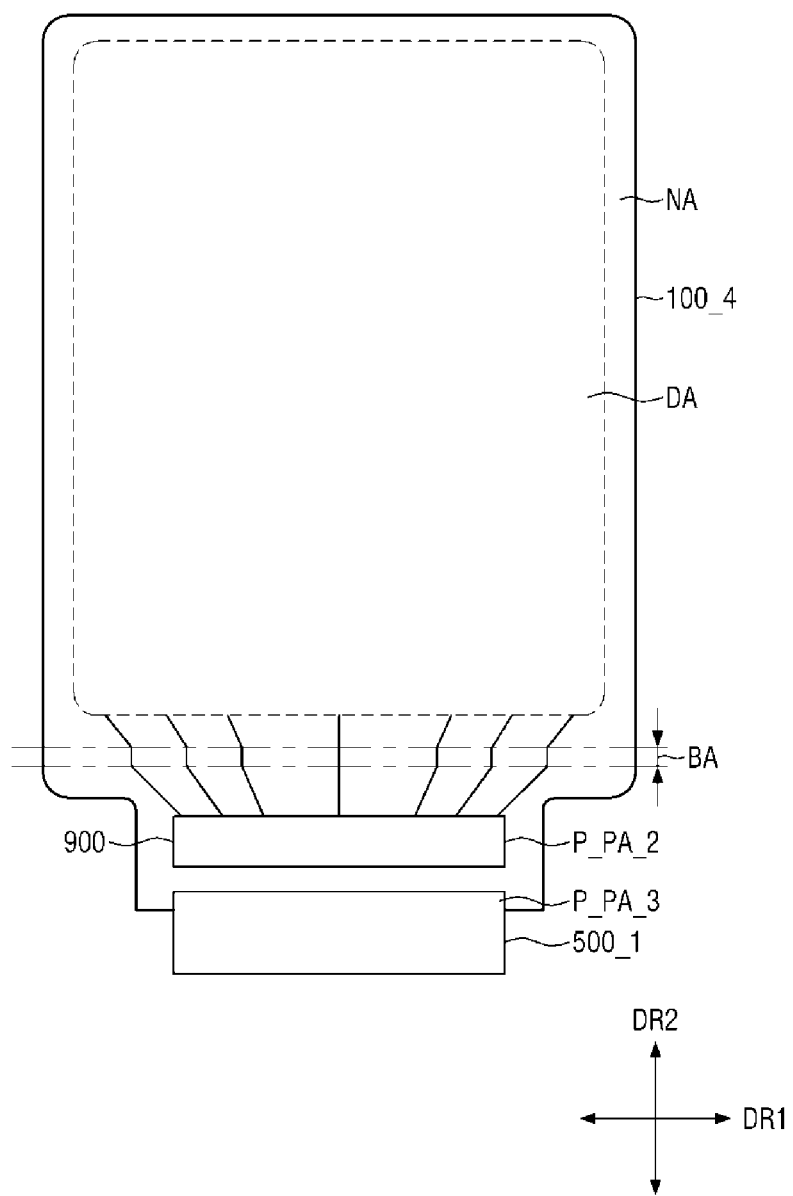
FIG. 17 is a plan view showing a layout of a display device constructed according to another exemplary embodiment.
Figure 18:
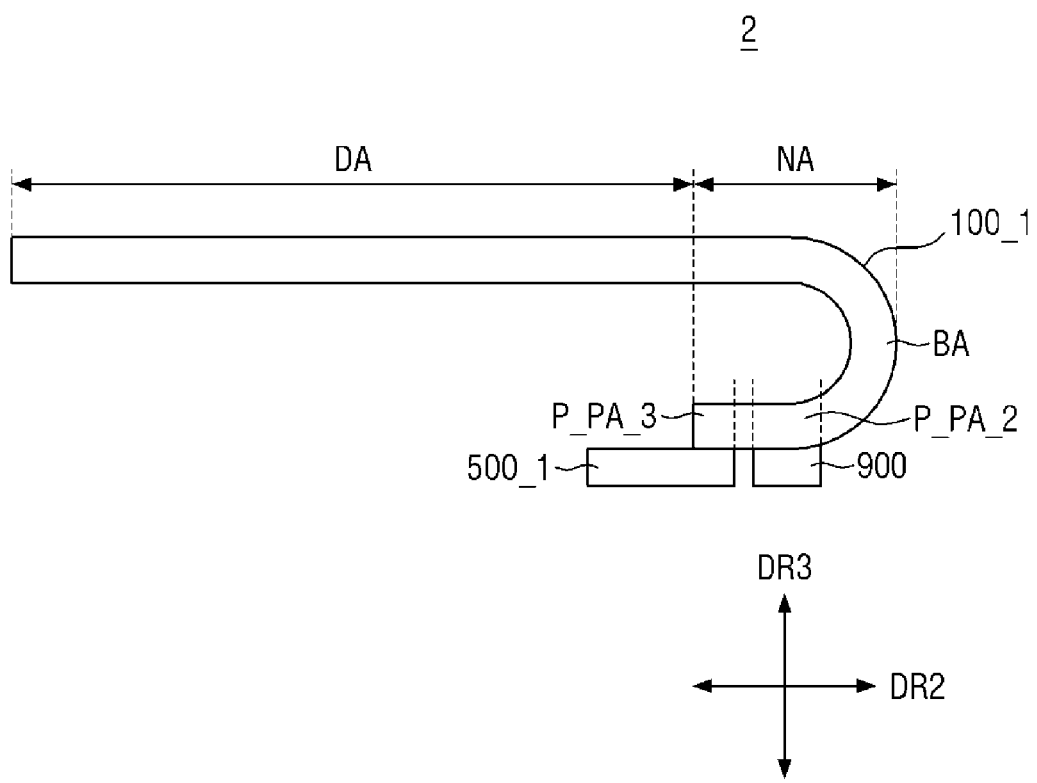
FIG. 18 is a cross-sectional view of FIG. 17.

FIG. 17 is a plan view showing a layout of a display device according to another exemplary embodiment, and FIG. 18 is a cross-sectional view of FIG. 17.

Referring to FIGS. 17 and 18, a display panel 100_4 of a display device 2 according to the exemplary embodiment may further include a bending area BA.

A display substrate of the display panel 100_4 may be formed of an insulating material such as a polymer resin. Examples of the polymeric material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The display substrate 101 may be a flexible substrate which can be bent, folded or rolled. As an example of a material of the flexible substrate, polyimide (PI) may be mentioned, but the exemplary embodiments are not limited thereto.

The bending area BA may be disposed between an array of the plurality of pixels and the panel pad area P_PA_1. The bending area BA may be located in the non-display area NA. The display panel 100_4 can be folded in one direction with respect to a bending line which is a reference line disposed in the bending area BA. The bending line may be a straight line parallel to the lower side (or the upper side) of the display panel 100_4. As shown in FIG. 23, the bending area BA of the display panel 100_4 may be bent downward in the third direction DR3.

However, the exemplary embodiments are not limited thereto, and the display area DA and the panel pad area P_PA_1 may be connected to each other without the bending area BA. That is, in the display panel 100_4, the display area DA and the non-display area NA may be entirely flat without the bending area BA.

In the panel pad area P_PA_1, the plurality of signal wirings PAD described above with reference to FIG. 5 are arranged. A driving integrated circuit 900 may be attached onto the plurality of signal wirings PAD.

In the exemplary embodiment, the driving integrated circuit 900 may be applied as a chip on plastic (COP) or a chip on glass (COG). The driving integrated circuit 900 may include a plurality of bumps connected to the plurality of signal wirings PAD. The bumps may be formed of at least one of gold (Au), nickel (Ni) and tin (Sn).

In the illustrated embodiment, the bumps of the driving integrated circuit 900 may be coupled in direct contact with the respective signal wirings PAD without intervention of other layers or structures. The direct coupling between the signal wirings PAD and the bumps of the driving integrated circuit 900 may be performed by ultrasonic bonding.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a display area including a plurality of pixels, and a pad area disposed at least partially around the display area; and
   a printed circuit board having a plurality of lead wirings attached to the pad area of the display panel,
   a plurality of signal wirings disposed on the pad area of the display panel and connected to the plurality of pixels, and
   a pattern disposed between at least some of the plurality of signal wirings and at least some of the plurality of lead wirings, the pattern comprising areas of higher rigidity than the signal wirings and the lead wirings.

2. The display device of claim 1, wherein the display panel includes a connection wiring disposed below the plurality of signal wiring and having a planar size smaller than the plurality of signal wiring, and an insulation pattern disposed between plurality of lead wiring and the plurality of signal wiring, and
   wherein the insulation pattern exposes a part of the connection wiring, and the exposed connection wiring is electrically connected to the plurality of signal wiring.

3. The display device of claim 2, wherein the high rigidity pattern is surrounded by the insulation pattern.

4. The display device of claim 3, wherein the plurality of signal wiring include a pad pressing portion which overlaps the high rigidity pattern, and a pad bonding portion which does not overlap the high rigidity pattern, and the pad pressing portion of the plurality of signal wiring is in contact with the high rigidity pattern.

5. The display device of claim 4, wherein the pad bonding portion is coupled to the plurality of lead wiring, and a thickness of the pad bonding portion from a surface of the connection wiring is greater than a thickness of the pad pressing portion from the surface of the connection wiring.

6. The display device of claim 5, wherein the pad bonding portion is directly connected to the plurality of lead wiring.

7. The display device of claim 6, wherein the pad bonding portion is ultrasonically connected to the plurality of lead wiring.

8. The display device of claim 5, wherein the plurality of lead wiring include a lead pressing portion which overlaps the high rigidity pattern, and a lead bonding portion which does not overlap the high rigidity pattern, and the plurality of lead pressing portion is in contact with the high rigidity pattern.

9. The display device of claim 8, wherein the lead wiring includes a first lead surface facing the signal wiring and a second lead surface opposite to the first lead surface, and a thickness from the second lead surface of the lead bonding portion to the first lead surface is greater than a thickness from the second lead surface of the lead pressing portion to the first lead surface.

10. The display device of claim 3, wherein the high rigidity pattern comprises plurality of inorganic units, the plurality of inorganic units are arranged in a direction from an end of the pad area toward the display area, and the insulation pattern includes a main pattern portion covering an edge of the connection wiring and a bridge pattern portion disposed between the adjacent plurality of inorganic units.

11. The display device of claim 10, wherein the plurality of inorganic units define a plurality of contact holes disposed between the main pattern portion and the bridge pattern portion, and each of the plurality of contact holes is disposed to overlap the plurality of inorganic units.

12. The display device of claim 11, wherein each of the plurality of signal wiring include a pad pressing portion which overlaps each of the plurality of inorganic units, a first pad bonding portion which does not overlap each of the plurality of inorganic units and does not overlap the insulation pattern, and a second pad bonding portion which does not overlap each of the plurality of inorganic units and overlaps the insulation pattern, and the pad pressing portion of the signal wiring is in contact with each of the plurality of inorganic units.

13. The display device of claim 12, wherein each of the first pad bonding portion and the second pad bonding portion are coupled to each of the plurality of lead wiring, and a thickness of the second pad bonding portion from a surface of the connection wiring is greater than a thickness of the first pad bonding portion from the surface of the connection wiring.

14. The display device of claim 1, wherein the high rigidity pattern comprises a plurality of inorganic areas.

15. The display device of claim 14, wherein the inorganic areas comprise an inorganic insulating material, and the inorganic insulating material comprises silicon oxide or nitrogen oxide.

16. The display device of claim 14, wherein the inorganic areas comprise a metal material.

17. A display device comprising:
- a display substrate having a display area including a plurality of pixels, and a pad area disposed at least partially around the display area;
- a plurality of signal wirings disposed on the pad area of the display substrate and connected to the pixels;
- a plurality of lead wirings attached to pads in the pad area;
- a connection wiring disposed below the plurality of signal wirings and having a planar size smaller than the signal wiring;
- an insulation pattern disposed between the plurality of lead wirings and the plurality of signal wiring; and
- a high rigidity pattern disposed on each of the signal wirings,
- wherein the insulation pattern exposes a part of the connection wiring, and the exposed connection wiring is electrically connected to the plurality of signal wirings,
- wherein each of the plurality of signal wirings includes a first surface facing the connection wiring and a second surface opposite to the first surface, and
- wherein the high rigidity pattern is disposed on the second surface of at least some of the plurality of signal wirings.

18. The display device of claim 17, wherein the inorganic pattern is surrounded by the insulation pattern,
- the plurality of signal wirings comprises a pad pressing portion which overlaps the high rigidity pattern, and a pad bonding portion which does not overlap the inorganic pattern, and
- the pad pressing portion of the plurality of signal wirings is in contact with the high rigidity pattern.

19. The display device of claim 18, wherein the pad bonding portion is coupled to the plurality of lead wirings,
- a thickness of the pad bonding portion from a surface of the connection wiring is greater than a thickness of the pad pressing portion from the surface of the connection wiring, and
- the pad bonding portion is directly connected to the plurality of lead wirings.

20. The display device of claim 19, wherein the pad bonding portion is ultrasonically connected to the plurality of lead wirings.

* * * * *